(12) United States Patent
Kim et al.

(10) Patent No.: US 11,631,769 B2
(45) Date of Patent: Apr. 18, 2023

(54) SEMICONDUCTOR DEVICE

(71) Applicant: SAMSUNG ELECTRONICS CO., LTD., Suwon-si (KR)

(72) Inventors: Geunwoo Kim, Seoul (KR); Wandon Kim, Seongnam-si (KR); Heonbok Lee, Suwon-si (KR); Yoontae Hwang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 31 days.

(21) Appl. No.: 17/321,960

(22) Filed: May 17, 2021

(65) Prior Publication Data

US 2022/0069129 A1    Mar. 3, 2022

(30) Foreign Application Priority Data

Sep. 1, 2020  (KR) .................. 10-2020-0111054

(51) Int. Cl.
*H01L 29/78*    (2006.01)
*H01L 29/417*    (2006.01)

(52) U.S. Cl.
CPC .... *H01L 29/7851* (2013.01); *H01L 29/41766* (2013.01); *H01L 29/41791* (2013.01); *H01L 29/785* (2013.01)

(58) Field of Classification Search
CPC .......... H01L 29/7851; H01L 29/41791; H01L 29/785; H01L 21/76871; H01L 21/28506;
(Continued)

(56) References Cited

U.S. PATENT DOCUMENTS 6,579,794 B1 * 6/2003 Oh .................. H01L 21/28556
257/E21.17
7,166,502 B1 * 1/2007 Kwon ............... H01L 29/78603
(Continued)

FOREIGN PATENT DOCUMENTS

CN       110010470 A  *  7/2019  ......... H01L 21/0262
KR    1994-0022708 A    10/1994

OTHER PUBLICATIONS

Butz et al., Grain Boundary Diffusion of Molybdenum in Tungsten, phys. stat. sol. (a) 7, K5 (1971) (Year: 1971).*
(Continued)

*Primary Examiner* — Earl N Taylor
(74) *Attorney, Agent, or Firm* — Lee IP Law, P.C.

(57) ABSTRACT

A semiconductor device includes: a fin-type active region extending on a substrate in a first direction; a gate structure extending across the fin-type active region in a second direction, different from the first direction; a source/drain region in the fin-type active region on one side of the gate structure; and first and second contact structures connected to the source/drain region and the gate structure, respectively, wherein at least one of the first and second contact structures includes a seeding layer on at least one of the gate structure and the source/drain region and including a first crystalline metal, and a contact plug on the seeding layer and including a second crystalline metal different from the first crystalline metal, and the second crystalline metal is substantially lattice-matched to the first crystalline metal at an interface between the seeding layer and the contact plug.

17 Claims, 14 Drawing Sheets

(58) Field of Classification Search
CPC ....... H01L 21/76877; H01L 21/823431; H01L 21/823475; H01L 29/0847; H01L 29/41766; H01L 29/43; H01L 29/45; H01L 29/456

See application file for complete search history.

(56) References Cited

U.S. PATENT DOCUMENTS

| | | | | |
|---|---|---|---|---|
| 8,211,797 | B2* | 7/2012 | Yang | H01L 27/1218 257/E21.585 |
| 8,778,797 | B2* | 7/2014 | Gao | H01L 21/76877 438/677 |
| 9,082,791 | B2* | 7/2015 | Kwon | H01L 29/66765 |
| 10,256,342 | B2* | 4/2019 | Park | H01L 29/66545 |
| 10,340,219 | B2* | 7/2019 | Hong | H01L 29/7851 |
| 10,734,280 | B2* | 8/2020 | Yim | H01L 21/76843 |
| 11,158,539 | B2* | 10/2021 | Wang | H01L 21/76804 |
| 11,393,756 | B2* | 7/2022 | Greenlee | H01L 27/11582 |
| 11,404,312 | B2* | 8/2022 | Wu | H01L 23/53266 |
| 2003/0057527 | A1* | 3/2003 | Chung | H01L 21/76862 257/E21.171 |
| 2007/0117372 | A1* | 5/2007 | Hsu | H01L 21/76895 257/E21.59 |
| 2008/0251851 | A1* | 10/2008 | Pan | H01L 29/7843 257/E29.345 |
| 2009/0032844 | A1* | 2/2009 | Ogura | H01L 29/7848 257/190 |
| 2009/0236627 | A1* | 9/2009 | Kim | H05K 3/1258 257/773 |
| 2012/0199887 | A1* | 8/2012 | Chan | C23C 16/16 118/725 |
| 2014/0011358 | A1* | 1/2014 | Chen | H01L 21/28506 438/680 |
| 2016/0190325 | A1* | 6/2016 | Liu | H01L 29/7856 257/770 |
| 2016/0300765 | A1* | 10/2016 | Li | H01L 21/28568 |
| 2017/0040214 | A1* | 2/2017 | Lai | H01L 21/76877 |
| 2018/0096934 | A1* | 4/2018 | Siew | H01L 21/76829 |
| 2018/0130707 | A1* | 5/2018 | Clendenning | H01L 21/76865 |
| 2018/0286957 | A1* | 10/2018 | Bae | H01L 27/1211 |
| 2019/0131421 | A1* | 5/2019 | Shen | H01L 29/665 |
| 2019/0148226 | A1* | 5/2019 | Yim | H01L 23/5226 257/383 |
| 2019/0157405 | A1* | 5/2019 | Huang | H01L 29/41766 |
| 2019/0164827 | A1* | 5/2019 | Yang | H01L 21/324 |
| 2019/0164885 | A1* | 5/2019 | Yang | H01L 23/5283 |
| 2019/0333808 | A1* | 10/2019 | Wu | H01L 29/66795 |
| 2019/0333856 | A1* | 10/2019 | Siew | H01L 21/76807 |
| 2020/0035787 | A1* | 1/2020 | Wang | H01L 23/535 |
| 2020/0235214 | A1* | 7/2020 | Huang | H01L 29/66795 |
| 2020/0343350 | A1* | 10/2020 | Lee | H01L 29/0847 |
| 2020/0395251 | A1* | 12/2020 | Chiu | H01L 21/76886 |
| 2021/0035861 | A1* | 2/2021 | Chen | H01L 21/3211 |
| 2021/0057533 | A1* | 2/2021 | Hwang | H01L 23/5226 |
| 2021/0098295 | A1* | 4/2021 | Wang | H01L 23/53242 |
| 2021/0098583 | A1* | 4/2021 | Tsai | H01L 29/401 |
| 2021/0175334 | A1* | 6/2021 | Yamazaki | H01L 27/1251 |
| 2021/0217861 | A1* | 7/2021 | Song | H01L 21/823814 |
| 2021/0226018 | A1* | 7/2021 | Wu | H01L 29/41766 |
| 2021/0273102 | A1* | 9/2021 | Su | H01L 29/66803 |
| 2021/0287990 | A1* | 9/2021 | Greenlee | H01L 27/11524 |
| 2021/0327877 | A1* | 10/2021 | Lee | H01L 29/41791 |
| 2021/0343713 | A1* | 11/2021 | Ju | H01L 29/66545 |
| 2021/0343851 | A1* | 11/2021 | Wang | H01L 29/42376 |
| 2021/0391471 | A1* | 12/2021 | Vellianitis | H01L 29/516 |
| 2021/0408276 | A1* | 12/2021 | Fu | H01L 21/7682 |
| 2022/0045052 | A1* | 2/2022 | Huang | H01L 29/0847 |
| 2022/0051991 | A1* | 2/2022 | Hopkins | H01L 23/5226 |
| 2022/0059654 | A1* | 2/2022 | Kim | H01L 29/0847 |
| 2022/0068650 | A1* | 3/2022 | More | H01L 29/45 |
| 2022/0069100 | A1* | 3/2022 | Hwang | H01L 21/76805 |
| 2022/0069129 | A1* | 3/2022 | Kim | H01L 29/41791 |
| 2022/0084879 | A1* | 3/2022 | Wu | H01L 29/456 |
| 2022/0102510 | A1* | 3/2022 | Cook | H01L 29/785 |
| 2022/0102522 | A1* | 3/2022 | Dewey | H01L 21/823475 |
| 2022/0108919 | A1* | 4/2022 | Wang | H01L 21/76805 |
| 2022/0157832 | A1* | 5/2022 | Yamaguchi | H01L 27/1159 |

OTHER PUBLICATIONS

Erley et al., The Diffusion Coefficients in the System Molybdenum-Tungsten, phys. stat. sol. (a) 25, 463 (1974) (Year: 1974).*

Franssila et al., Reduction of molybdenum resistivity by a seed layer of Ti-W, Microelectronic Engineering 37/38 (1997) 373-380 (Year: 1997).*

Hao et al., Effect of grain boundary misorientation angle on diffusion behavior in molybdenum-tungsten systems, Journal of Alloys and Compounds 819 (2020) 152975 (Year: 2020).*

* cited by examiner

SEMICONDUCTOR DEVICE

CROSS-REFERENCE TO RELATED APPLICATION

Korean Patent Application No. 10-2020-0111054, filed on Sep. 1, 2020, in the Korean Intellectual Property Office, and entitled: "Semiconductor Device," is incorporated by reference herein in its entirety.

BACKGROUND

1. Field

Embodiments relate to a semiconductor device.

2. Description of the Related Art

A semiconductor device may include an integrated circuit including various transistors. With high-density integration of semiconductor elements, scaling down of transistors has been gradually accelerated, and accordingly, a critical dimension (CD) of a contact has also decreased.

SUMMARY

Embodiments are directed to a semiconductor device, including: a fin-type active region extending on a substrate in a first direction that is parallel to an upper surface of the substrate; a gate structure extending across the fin-type active region in a second direction, parallel to the upper surface of the substrate and different from the first direction; a source/drain region in the fin-type active region on one side of the gate structure; an insulating portion covering the gate structure and the source/drain region; a first contact structure penetrating through the insulating portion and connected to the source/drain region; and a second contact structure penetrating through the insulating portion and connected to the gate structure. At least one of the first and second contact structures may include a seeding layer on at least one of the gate structure and the source/drain region and including a first crystalline metal, and a contact plug on the seeding layer and including a second crystalline metal different from the first crystalline metal. The second crystalline metal may be substantially lattice-matched to the first crystalline metal at an interface between the seeding layer and the contact plug.

Embodiments are also directed to a semiconductor device, including: a substrate having a contact region; a first insulating layer on the substrate and having a first contact hole connected to the contact region; a first seeding layer on the contact region in the first contact hole and including a first crystalline metal; and a first contact metal on the first seeding layer, filling the first contact hole, and including a second crystalline metal. The second crystalline metal may be substantially lattice-matched to the first crystalline metal at an interface between the first and second crystalline metals.

Embodiments are also directed to a semiconductor device, including: a fin-type active region extending on a substrate in a first direction, parallel to an upper surface of the substrate; a gate structure extending across the fin-type active region in a second direction, which is parallel to the upper surface of the substrate and different from the first direction; a source/drain region in the fin-type active region on one side of the gate structure; a first contact structure connected to the source/drain region; and a second contact structure connected to the gate structure. At least one of the first and second contact structures may include a seeding layer on at least one of the gate structure and the source/drain region, and a contact plug on the seeding layer. The seeding layer may include a first crystalline conductive material, the contact plug includes a second crystalline conductive material. The first and second crystalline conductive materials may have a same crystal structure, and a difference between lattice constants of the first and second crystalline conductive materials may be less than 1%.

BRIEF DESCRIPTION OF DRAWINGS

Features will become apparent to those of skill in the art by describing in detail example embodiments with reference to the attached drawings in which.

DETAILED DESCRIPTION

Figure 1:
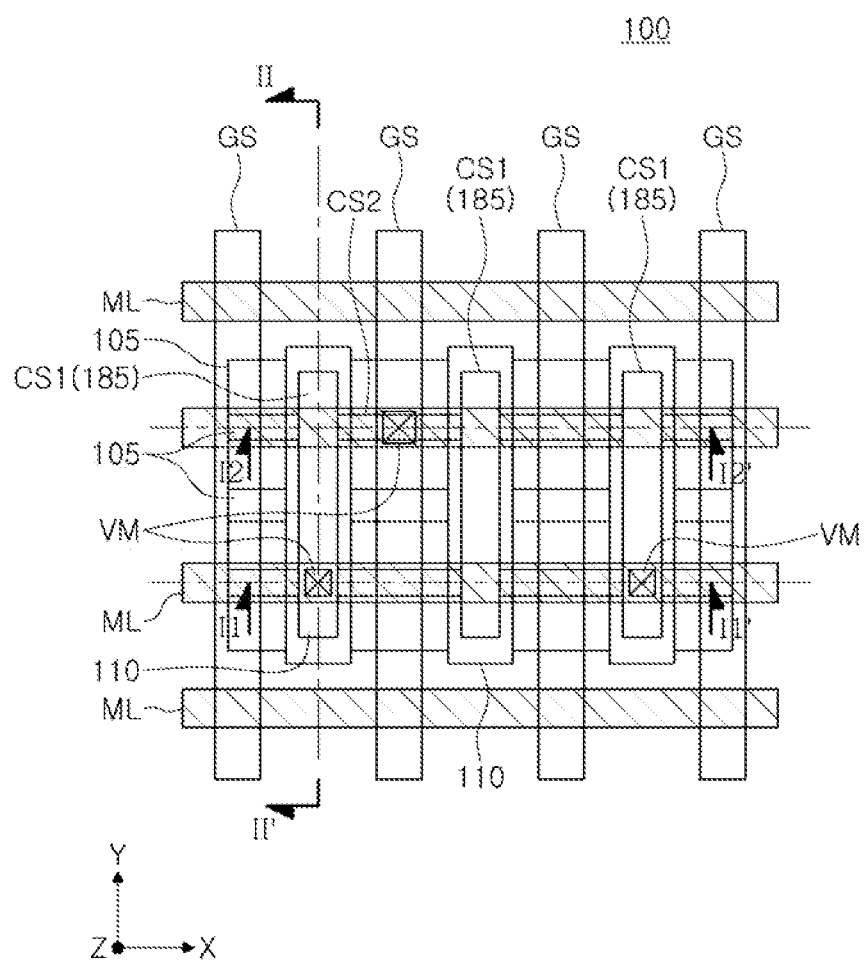
FIG. 1 is a plan view illustrating a semiconductor device according to an example embodiment.
Figure 2A:
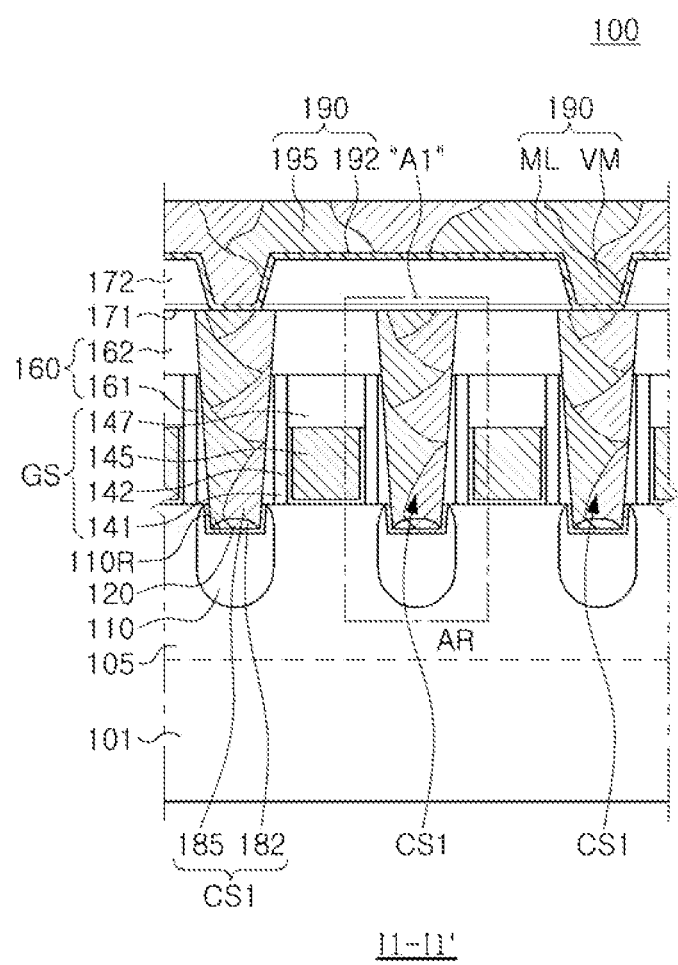
FIGS. 2A through 2C are cross-sectional views of the semiconductor device illustrated in FIG. 1, taken along lines I1-I1', I2-I2', II-II', and respectively.
Figure 2B:
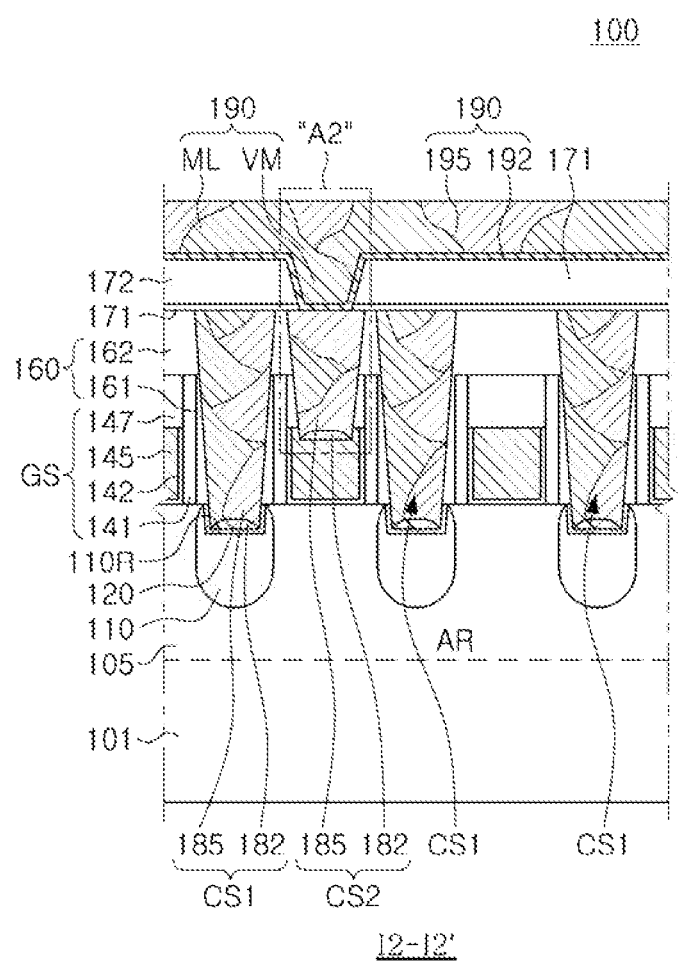
Figure 2C:
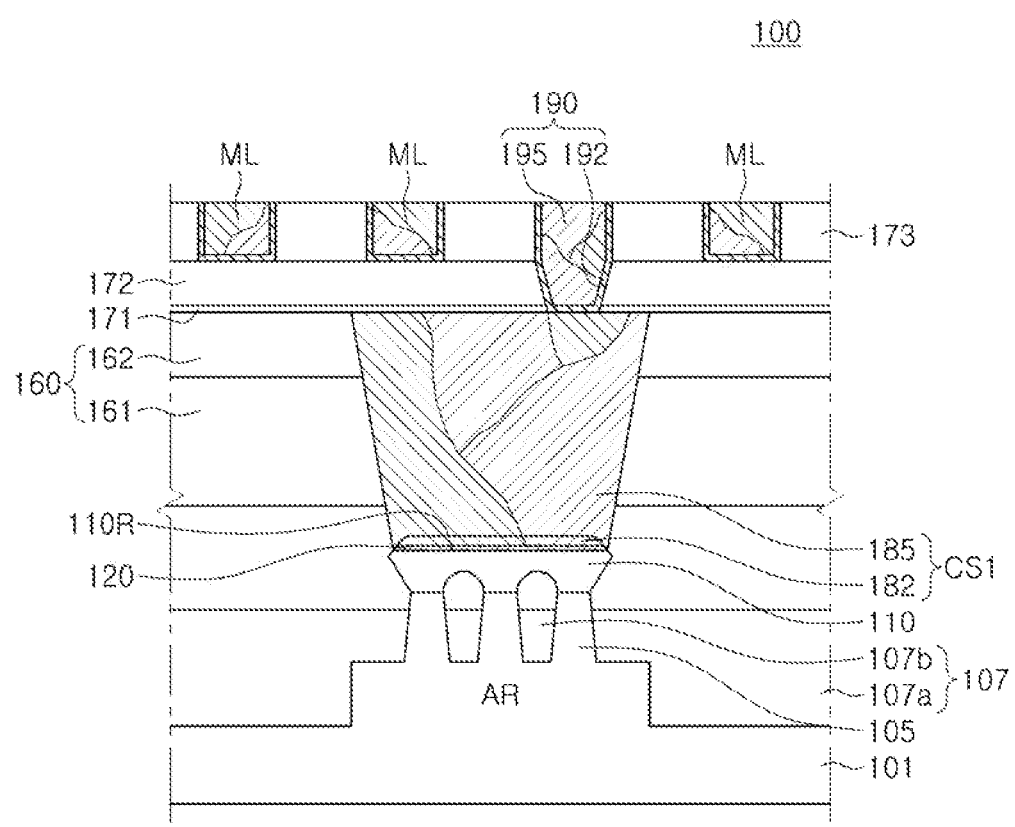

FIG. 1 is a plan view illustrating main components of a semiconductor device according to an example embodiment, and FIGS. 2A through 2C are cross-sectional views of the semiconductor device illustrated in FIG. 1, taken along lines I1-I1', I2-I2', and II-II', respectively.

Referring to FIGS. 1 and 2A through 2C, a semiconductor device 100 according to the present example embodiment may include a fin-type active region 105 extending on a substrate 101 in a first direction (X direction of FIG. 1) parallel to an upper surface of the substrate 101, and a gate structure GS extending across the fin-type active region 105 in a second direction (Y direction of FIG. 1), which is different from the first direction (X direction).

The substrate 101 may include a Group IV semiconductor such as Si or Ge, a Group IV-IV compound semiconductor such as SiGe or SiC, or a Group III-V compound semiconductor such as GaAs, InAs, or InP. The substrate 101 may include an active region AR. The active region AR may be a conductive region such as a well that is doped with an impurity or a structure that is doped with an impurity. In an example embodiment, the active region AR may be an N-type well for a P-type metal-oxide semiconductor (PMOS) transistor, or a P-type well for an N-type metal-oxide semiconductor (NMOS) transistor.

The fin-type active region 105 may be on an upper surface of the active region AR. The fin-type active region 105 may have a structure that protrudes from the upper surface of the active region AR in a third direction (Z direction of FIG. 1) (which is perpendicular to the first and second directions). The fin-type active region 105 may be referred to herein as an active fin 105.

In the present example embodiment, the number of active fins 105 is three, but is not limited thereto. A single active fin 105 may be formed, or a different number of multiple active fins 105 may be formed. As illustrated in FIG. 1, three active fins 105 may be arranged parallel to one another on the active region AR in the second direction, and may each extend in the first direction (X direction). The active fin 105 may be provided as an active region of a transistor.

A device isolation film 107 may define the active region AR and the active fin 105. In an example embodiment, the device isolation film 107 may be formed of an insulating material such as silicon oxide. The device isolation film 107 may include a first isolation region 107a defining the active region AR, and a second isolation region 107b defining the active fin 105. The first isolation region 107a may have a bottom surface deeper than that of the second isolation region 107b. The first isolation region 107a may be a deep trench isolation (DTI). The first isolation region 107a may be a shallow trench isolation (STI). The second isolation region 107b may be on the active region AR. The active fin 105 may penetrate through the second isolation region 107b and partially protrude from an upper surface of the second isolation region 107b.

The gate structure GS may have a line structure expending in the second direction (Y direction) intersecting the first direction (X direction) as illustrated in FIG. 1. The gate structure GS may overlap with a region of the active fin 105.

The gate structure GS may include gate spacers 141, a gate insulating layer 142 sequentially disposed between the gate spacers 141, a gate electrode 145, and a gate capping layer 147 on the gate electrode 145.

The gate electrode 145 may be formed of doped polysilicon, metal, a conductive metal nitride, a conductive metal carbide, or a combination thereof. For example, the gate electrode 145 may be formed of Al, Cu, Ti, Ta, W, Mo, TaN, NiSi, CoSi, TiN, WN, TiAl, TiAlN, TaCN, TaC, or TaSiN, or a combination thereof, but the material of the gate electrode 145 is not limited thereto. In an example embodiment, the gate electrode 145 may include a work-function-metal-containing layer and a gap-fill metal film. The work-function-metal-containing layer may contain at least one metal selected from Ti, W, Ru, Nb, Mo, Hf, Ni, Co, Pt, Yb, Tb, Dy, Er, and Pd. The gap-fill metal film may be a W film or an Al film. In an example embodiment, the gate electrode 145 may include a stack structure of TiAlC/TiN/W, a stack structure of TiN/TaN/TiAlC/TiN/W, or a stack structure of TiN/TaN/TiN/TiAlC/TiN/W, but is not limited thereto.

The gate insulating layer 142 may be on a bottom surface and side walls of the gate electrode 145, and may extend in the second direction (the Y direction of FIG. 1) along the bottom surface of the gate electrode 145. The gate insulating layer 142 may be interposed between the gate electrode 145 and the active fin 105, and between the gate electrode 145 and the upper surface of the device isolation film 107. Examples of the gate insulating layer 142 may include a silicon oxide film, a silicon oxynitride film, a high dielectric film having a dielectric constant higher than that of the silicon oxide film, and a combination thereof. The high dielectric film may be formed of a metal oxide or a metal oxynitride. For example, the high dielectric film that may be used as the gate insulating layer 142 may include $HfO_2$, HfSiO, HfSiON, HfTaO, HfSiO, HfZrO, $ZrO_2$, $Al_2O_3$ or a combination thereof, but is not limited thereto.

The gate capping layer 147 may be on the gate electrode 145. The gate capping layer 147 may cover an upper surface of the gate electrode 145 and extend in the second direction (the Y direction of FIG. 1). For example, the gate capping layer 147 may include silicon nitride or silicon oxynitride. The gate spacers 141 may be on opposite side walls of the gate electrode 145 and opposite side walls of the gate capping layer 147. The gate spacers 141 may extend on the opposite side walls of the gate electrode 145 along the direction in which the gate electrode 145 extends, and the gate insulating layer 142 may be interposed between the gate electrode 145 and the gate spacers 141. In an example embodiment, the gate spacer 141 may include silicon oxide (SiOx), silicon nitride (SiNx), silicon oxynitride (SiOxNy), silicon carbonitride (SiCxNy), silicon oxycarbonitride (SiOxCyNz), or a combination thereof. In an example embodiment, the gate spacer 141 may include a plurality of layers that each are formed of a different material. Although FIGS. 2A and 2B illustrate a case where the gate spacer 141 includes a single layer, the gate spacer 141 may include a plurality of spacer layers that are sequentially stacked on the side wall of the gate electrode 145 and each have a different dielectric constant.

The semiconductor device 100 according to the present example embodiment may include source/drain regions 110 in partial regions of the active fin 105 that are positioned on opposite sides of the gate structure GS.

The source/drain regions 110 may be formed by forming recesses in the partial regions of the active fin 105 and performing selective epitaxial growth (SEG) on the recesses. The source/drain region 110 may be formed of, e.g., Si, SiGe, or Ge. The source/drain region 110 may have a different material or different shape between an N-type transistor and a P-type transistor. For example, in a case of the PMOS transistor, the source/drain region 110 may be formed of silicon-germanium (SiGe), and may be doped with a P-type impurity (for example, boron (B), indium (In), or gallium (Ga)). A cross section (Y-Z cross section, see FIG. 2C) of the source/drain region 110 may have a pentagonal shape. In a case of the NMOS transistor, the source/drain region 110 may be formed of silicon, and may be doped with an N-type impurity (for example, phosphorus (P), nitrogen (N), arsenic (As), or antimony (Sb)). A cross section (Y-Z cross section) of the source/drain region 110 may have a hexagonal shape or have a polygonal shape having a gentle angle. As such, the source/drain region 110, the active fin 105, and the gate structure GS may form a three-dimensional semiconductor element such as a fin field-effect transistor (FinFET).

The semiconductor device 100 according to the present example embodiment may include a first contact structure CS1 penetrating through an insulating portion 160 and connected to the source/drain region 110, and a second contact structure CS2 penetrating through the insulating portion 160 and connected to the gate electrode 145 of the gate structure GS.

The insulating portion 160 may include an inter-gate insulating film 161 and a capping insulating film 162 that are sequentially stacked on the source/drain region 110. The inter-gate insulating film 161 may be disposed between adjacent gate structures GS, and cover the source/drain region 110 and the device isolation film 107. The inter-gate insulating film 161 may have an upper surface that is substantially coplanar with upper surfaces of the gate spacer 141 and the gate capping layer 147. In an example embodiment, at least one of the inter-gate insulating film 161 or the capping insulating film 162 may be formed of silicon nitride, silicon oxide, or silicon oxynitride. In an example embodiment, the inter-gate insulating film 161 may be formed of TEOS, USG, PSG, BSG, BPSG, FSG, SOG, TOSZ, or a combination thereof. The inter-gate insulating film 161 may be formed by, e.g., chemical vapor deposition (CVD) or spin-coating.

In the present example embodiment, each of the first and second contact structures CS1 and CS2 may include a seeding layer 182 and a contact plug 185 on the seeding layer 182. The seeding layer 182 may be on each of the gate electrode 145 and the source/drain region 110.

The seeding layer 182 may be positioned on the bottom of each of the first and second contact structures CS1 and CS2 to enhance bonding strength between the gate electrode 145 and the contact plug 185 and between the source/drain region 110 and the contact plug 185. As a result, the seeding layer 182 may effectively prevent the contact plug 185 from falling off during processing such as chemical-mechanical polishing (CMP) (see FIG. 6D).

According to the present example embodiment, the seeding layer 182 includes a first crystalline metal, and the contact plug 185 includes a second crystalline metal different from the first crystalline metal. The crystalline metal may include a polycrystalline metal or a monocrystalline metal. The seeding layer 182 may be formed of a metal having a relatively low resistance like the contact plug 185. Thus, a contact resistance may be decreased. In a case where the first and second crystalline metals are polycrystalline metals, the contact plug 185 may have an increased grain size according to a grain size of the seeding layer 182, i.e., the first crystalline metal. A mean free path may decrease due to the increase in grain size. Thus, the contact plug 185 may be formed of a material having a low resistance.

Figure 3:
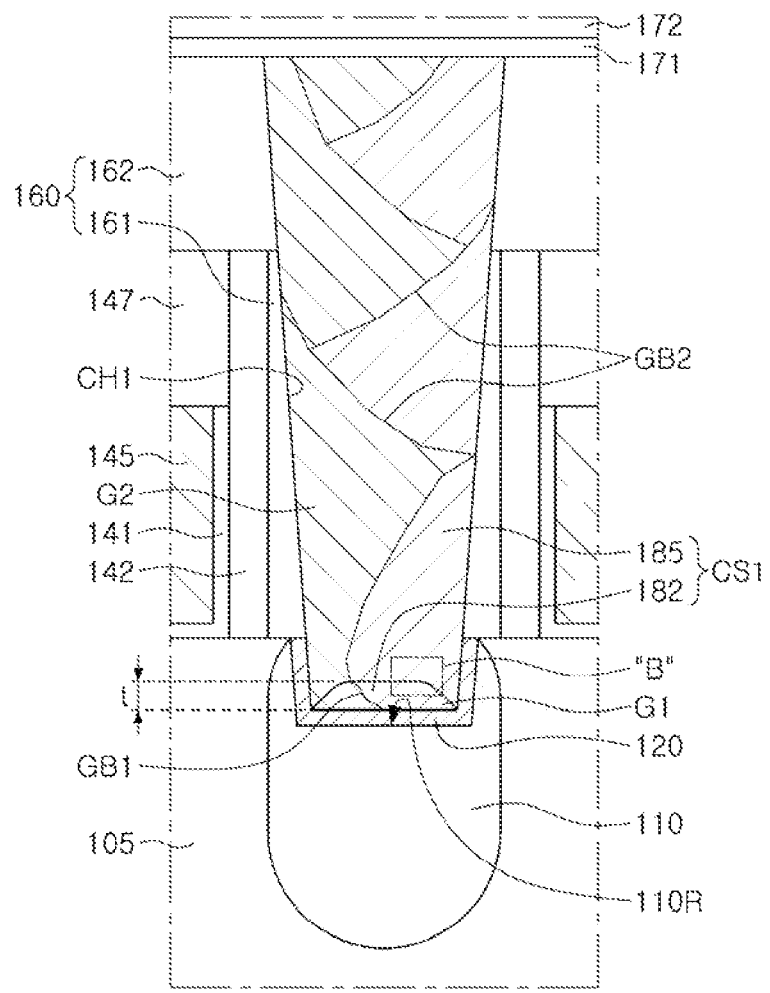
FIG. 3 is an enlarged view illustrating a part "A1" of the semiconductor device illustrated in FIG. 2A.

FIG. 3 is an enlarged view of a part "A1" of the semiconductor device illustrated in FIG. 2A.

Referring to FIG. 3, a metal silicide film 120 may be on the source/drain region 110. The metal silicide film 120 may be on a recessed region 110R of the source/drain region 110. The metal silicide film 120 may be a crystalline silicide film. For example, the metal silicide film 120 may be a silicide film containing Ti, W, Ru, Nb, Mo, Hf, Ni, Co, Pt, Yb, Tb, Dy, Er, Pd, or a combination thereof. In an example embodiment, the metal silicide film 120 may be formed of CoSi, NiSi, or TiSi.

The first contact structure CS1 may include the seeding layer 182 on the metal silicide film 120, and the contact plug 185 on the seeding layer 182. In the present example embodiment, each of the seeding layer 182 and the contact plug 185 may be formed of a polycrystalline metal.

In the present example embodiment, the seeding layer 182 includes a first crystalline metal including first grains G1, and the contact plug 185 includes a second crystalline metal including second grains G2. In the present example embodiment, the first and second grains G1 and G2 are defined by ground boundaries GB1 and GB2, respectively, and may each have in-plane crystalline orientation. In order to assist in understanding, the crystalline orientation of each of the crystal grains G1 and G2 is schematically illustrated as diagonal lines in each of the crystal grains G1 and G2 in FIG. 3. In the present example embodiment, the crystalline orientation of the second crystalline metal depends on the crystalline orientation of the first crystalline metal, which is the seeding layer 182, and the second crystalline metal may be deposited on the first crystalline metal like the epitaxial growth. Such a crystalline orientation may be confirmed by an X-ray diffraction method.

Figure 4:
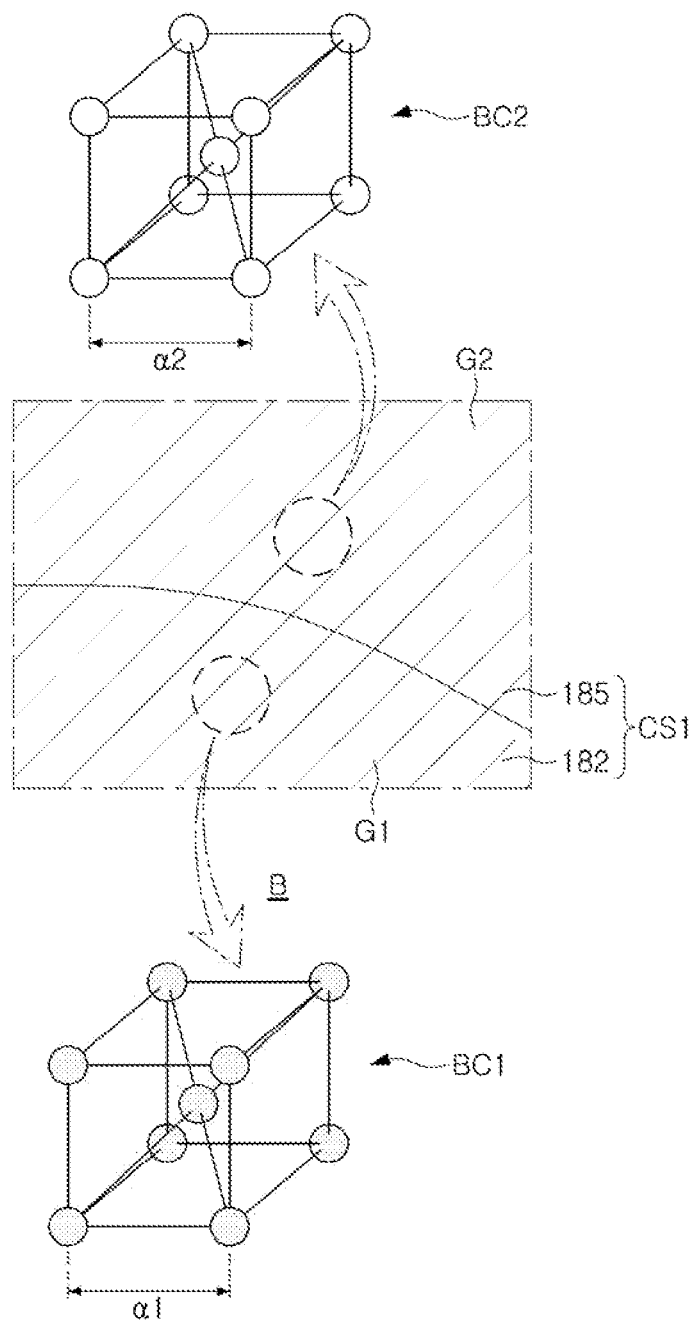
FIG. 4 is a schematic diagram illustrating a crystal structure at an interface between a seeding layer and a contact plug in a contact structure illustrated in FIG. 3.

As illustrated in FIG. 4, the second crystalline metal may be substantially lattice-matched to the first crystalline metal at an interface between the seeding layer 182 and the contact plug 185. That is, the crystal lattice in the first grains G1 and the crystal lattice in the second grains G2 adjacent to the first grains G1 may be substantially matched to each other, and a potential caused by mismatching may hardly exist in the adjacent second grains G2. A condition for such a lattice-matching may be determined based on conditions of a crystal structure and a lattice constant. The first and second crystalline metals may have the same crystal structure (for example, a body centered cubic (BCC) structure). Further, lattice constants $\alpha 1$ and $\alpha 2$ of the first and second crystalline metals may be substantially the same as each other or a difference between the lattice constants $\alpha 1$ and $\alpha 2$ of the first and second crystalline metals may be significantly small. For example, the difference between the lattice constants $\alpha 1$ and $\alpha 2$ of the first and second crystalline metals may be less than 1%.

In an example embodiment, one of the seeding layer 182 and the contact plug 185 may include tungsten (W), and the other one of the seeding layer 182 and the contact plug 185 may include molybdenum (Mo). For example, the seeding layer 182 may include tungsten (W) and the contact plug 185 may include molybdenum (Mo). Tungsten (W) and molybdenum (Mo) may have the same body centered cubic structures BC1 and BC2 as crystal structures illustrated in FIG. 4, and lattice constants $\alpha 1$ and $\alpha 2$ thereof may be 3.16 Å and 3.15 Å, respectively, and a difference between the lattice constants $\alpha 1$ and $\alpha 2$ may be less than 1%. Molybdenum (as the second crystalline metal) may be deposited on tungsten (as the first crystalline metal), like the epitaxial growth, and crystal lattices of adjacent first and second grains may be matched to each other. In such a lattice-matching, the grains G2 of the contact plug 185 may have an increased size according to the size of the grains G1 of the seeding layer 182. As the grain size increases, the contact plug 185 having a low resistance may be provided. The grains G2 of the contact plug 185 may have, but is not limited to, a size of 7 nm or more, or a size of 10 nm or more. In an example embodiment, in a case where the contact plug 185 includes molybdenum, a specific resistance of the contact plug 185 may be 50 μΩ·cm or less, or 10 μΩ·cm or less.

The seeding layer 182 may be on a bottom of a first contact hole CH1 for the first contact structure CS1. The contact plug 185 may be provided in the first contact hole CH1 without a barrier film. A side wall of the contact plug 185 may be in direct contact with the insulating portion 160. By omitting a barrier film having a relatively large resistance, a contact resistance between the contact plug 185 and the metal silicide film 120 may decrease, and the size (in particular, the width) of the first contact structure CS1 may decrease.

In an example embodiment, the thickness t of the seeding layer 182 may be 5 nm or less or 3 nm or less, but is not limited thereto. The first crystalline metal for the seeding layer 182 may be formed by deposition such as physical vapor deposition (PVD) to secure a desired crystallinity.

In the present example embodiment, a case where the seeding layer 182 is formed of a metal is illustrated. However, the seeding layer 182 may also be formed of another crystalline conductive material, e.g., a crystalline metal compound, that is lattice matched with the metal of the contact plug 185.

Figure 5:
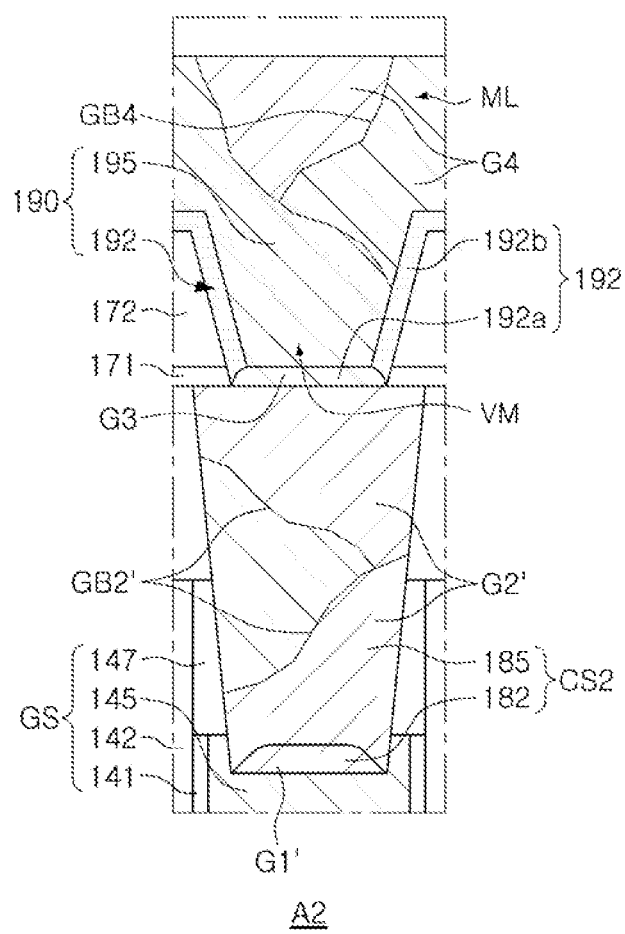
FIG. 5 is an enlarged view illustrating a part "A2" of the semiconductor device illustrated in FIG. 2B.

Referring to FIG. 5, the second contact structure CS2 related to the gate structure GS may be implemented as a low-resistance contact structure, like the first contact structure CS1. FIG. 5 is an enlarged view illustrating a part "A2" of the semiconductor device illustrated in FIG. 2B.

The second contact structure CS2 illustrated in FIG. 5 may include the seeding layer 182 on the gate electrode 145, and the contact plug 185 on the seeding layer 182. In the present example embodiment, each of the seeding layer 182 and the contact plug 185 may be formed of a polycrystalline metal. In an example embodiment, in a case where the gate electrode 145 includes polysilicon, a metal silicide film may be formed in a contact region of the gate electrode 145, like the first contact structure CS1.

Like the first contact structure CS1, the seeding layer 182 includes a first crystalline metal including first grains G1', and the contact plug 185 includes a second crystalline metal including second grains G2'. The first grains G1' and the second grains G2' may be defined by ground boundaries GB2', respectively. In the second contact structure CS2, the seeding layer 182 is also formed of a polycrystalline metal like the contact plug 185. However, since the seeding layer 182 has a small area due to relatively small thickness, there is a possibility that the grain boundary is not observed in some selected cross sections.

The crystalline orientation of the second crystalline metal depends on the crystalline orientation of the first crystalline metal, which is the seeding layer 182, and the second crystalline metal may be deposited on the first crystalline metal like the epitaxial growth. The second crystalline metal may be substantially lattice-matched to the first crystalline metal at an interface between the seeding layer 182 and the contact plug 185. Like the first contact structure CS1, one of the seeding layer 182 and the contact plug 185 of the second contact structure CS2 may include tungsten (W) and the other one of the seeding layer 182 and the contact plug 185 may include molybdenum (Mo). For example, the seeding layer 182 may include tungsten (W), and the contact plug 185 may include molybdenum (Mo). The second contact structure CS2 may be formed by processing like that for the first contact structure CS1.

The semiconductor device 100 may include a wiring line 190 connected to the first and second contact structures CS1 and CS2 on the first and contact structures CS1 and CS2. The wiring line 190 may include a part of wiring formed as part of a back end of line (BEOL).

First and second inter-layer insulating layers 172 and 173 may be on the insulating portion 160. An etch stop film 171 may be disposed between the insulating portion 160 (particularly, the capping insulating film 162) and the first inter-layer insulating layer 172. In an example embodiment, the etch stop film 171 may be formed of silicon nitride, silicon carbonitride, or aluminum nitride, or aluminum oxide. In an example embodiment, the first and second inter-layer insulating layers 172 and 173 may be formed of silicon oxide, silicon nitride, or silicon oxynitride.

The wiring line 190 may include metal lines ML extending in the first direction (the X direction of FIG. 1), and metal vias (VM) disposed between the first and second contact structures CS1 and CS2, and the metal lines ML.

The wiring line 190 on the first and second contact structures may be formed by a combination of the seeding layer 182 and the contact plug 185, like the first and second contact structures CS1 and CS2. For example, as illustrated in FIG. 5, the wiring line 190 may include a wiring line seeding layer 192 in at least a partial region of an upper surface of the second contact structure CS2 (particularly, the contact plug 185), and a fill metal 195 on the wiring line seeding layer 192.

The wiring line seeding layer 192 may be formed of a crystalline conductive material. As illustrated in FIG. 5, the wiring line seeding layer 192 may be formed in the region of the upper surface of the contact plug 185 exposed to a via hole, as well as in an upper surface (including the surface of the via hole) of the first inter-layer insulating layer 172. In the wiring line seeding layer 192, as illustrated in FIG. 5, a crystalline conductive material including third grains G3 may be deposited in a first region 192a positioned on the contact plug 185, and an amorphous or amorphous-like conductive material may be deposited in a second region 192b positioned on the surface of the first inter-layer insulating layer 172, which may be amorphous.

The fill metal 195 may include a crystalline metal. At least on the first region 192a of the wiring line seeding layer 192, the crystalline orientation of the fill metal 195 may affect the crystalline orientation in the first region 192a at a boundary to which the third grains G3 and fourth grains G4 are adjacent. In addition, crystal growth of the fill metal 195 may be made even in the second region 192b (which is adjacent to the first region 192a), like that in the first region 192a. The fourth grains G4 defined by a grain boundary GB4 may have a relatively large size, and as a result, the wiring line 190 may be implemented as a low-resistance structure. In an example embodiment, the wiring line seeding layer 192 may be formed of a conductive material such as tungsten (W), titanium nitride (TiN), tantalum nitride (TaN), titanium silicon nitride (TiSiN), tungsten carbonitride (WCN), or tungsten nitride (WN). Examples of the fill metal 195 may include metals such as molybdenum (Mo), ruthenium (Ru), tungsten (W), cobalt (Co), and copper (Cu).

In an example embodiment, like the first and second contact structures CS1 and CS2 described above, conditions of crystal structures and lattice constants of the wiring line seeding layer 192 and the fill metal 195 may be selected so that crystal lattices of the third grains G3 of the wiring line seeding layer 192 and the adjacent fourth grains G4 are substantially matched to each other. In an example embodiment, the crystal structures of the two materials may be the same as each other, and a difference between the lattice constants of the two materials may be less than 1%. For example, one of the wiring line seeding layer 192 and the fill metal 195 may include tungsten (W) and the other one of the wiring line seeding layer 192 and the fill metal 195 may include molybdenum (Mo).

FIGS. 6A through 6D are cross-sectional views illustrating main processes of a method for manufacturing a semiconductor package according to an example embodiment.

A process of forming the first contact structure in the semiconductor device 100 described above will be described in detail with reference to FIGS. 6A through 6D. For convenience of explanation, the cross-sectional views show enlarged views of the part "A1" of FIG. 2A as illustrated in FIG. 3. Here, although some of the components of the present example embodiment are schematically illustrated, those may be understood with reference to a description of the same or similar components of the example embodiment illustrated in FIGS. 1 through 5, unless clearly indicated otherwise.

Figure 6A:
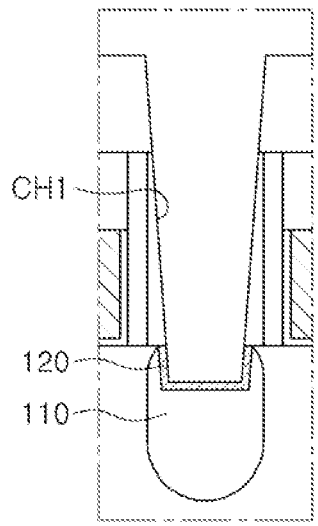
FIGS. 6A through 6D are cross-sectional views illustrating main processes of a method for manufacturing a semiconductor package according to an example embodiment.

Referring to FIG. 6A, the first contact hole CH1 connected to the source/drain region 110 may be formed, and the metal silicide film 120 may be formed on a surface of the source/drain region 110 exposed to the first contact hole CH1.

The first contact hole CH1 defining the first contact structure may be formed by sequentially etching the inter-gate insulating film 161 and the capping insulating film 162 by using an etching mask. A partial region of the source/drain region 110 may be exposed to the first contact hole CH1. The exposed partial region of the source/drain region 110 may be recessed to a predetermined depth in the process of forming the first contact hole CH1. In this process, a second contact hole CH2 defining the second contact structure may also be formed.

The metal silicide film 120 may be formed on the exposed region of the source/drain region 110 by forming a metal layer on the recessed region of the source/drain that is exposed to the first contact hole CH1 and performing annealing.

Figure 6B:
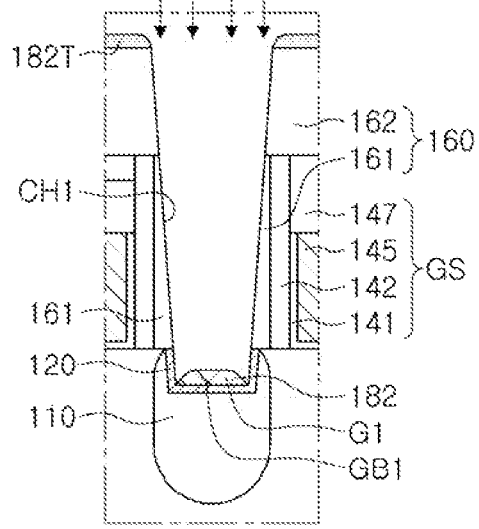

Next, referring to FIG. 6B, the seeding layer 182 may be deposited on the metal silicide film 120.

The seeding layer 182 may include a crystalline metal such as a monocrystalline metal or a polycrystalline metal. The seeding layer 182 may be formed by linear deposition such as PVD to secure a sufficient crystallinity. With such a linear deposition, the seeding layer 182 may be formed not only on a desired portion of the metal silicide film 120 positioned on the bottom of the first contact hole CH1, but also on an upper surface of the insulating portion 160. A seed material layer 182T positioned on the insulating portion 160 may be removed in subsequent processing. The seeding layer 182 may have, but is not limited to, a thickness of 5 nm or less, or a thickness of 3 nm or less.

A material used to form the seeding layer 182 may be selected in consideration of a condition for lattice matching with the contact plug 185 (FIG. 6D) to be formed in subsequent processing. In an example embodiment, the seeding layer 182 may include tungsten (W) or molybdenum (Mo). The material used to form the seeding layer 182 may include a conductive material such as a crystalline metal compound suitable for the above-described condition for lattice matching with the metal of the contact plug 185. For example, the seeding layer 182 may include a conductive material such as tungsten (W), titanium nitride (TiN), tantalum nitride (TaN), titanium silicon nitride (TiSiN), tungsten carbonitride (WCN), or tungsten nitride (WN).

Figure 6C:
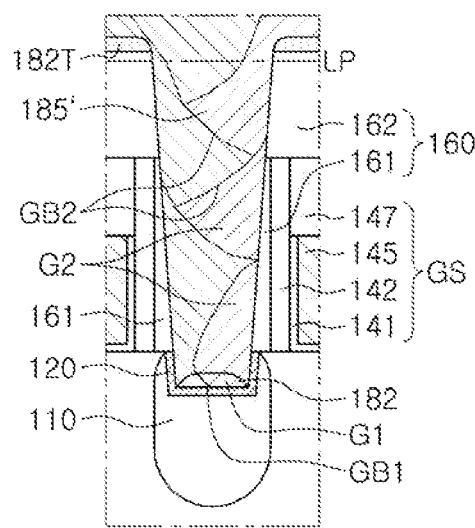

Then, referring to FIG. 6C, the contact plug 185 may be formed to fill the first contact hole CH1 by using the seeding layer 182.

In this processing, a metal material layer 185' for the contact plug may be formed to cover the upper surface of the insulating portion 160 while filling the first contact hole CH1. The metal material layer 185' may be formed of a metal such as molybdenum (Mo), ruthenium (Ru), tungsten (W), cobalt (Co), or copper (Cu). The metal material layer 185' for the contact plug may be grown to have specific orientation according to crystalline orientation of the seeding layer 182, and may have a relatively large grain size. The metal material layer 185' may include a crystalline metal that is suitable for lattice matching with the seeding layer 182. Crystal structures of the two materials may be the same as each other, and a difference between lattice constants of the two materials may be less than 1%. For example, the metal material layer 185' may include molybdenum (Mo) or tungsten (W). In an example embodiment, the seeding layer 182 may include tungsten (W) and the metal material layer 185' may include molybdenum (Mo).

In the present example embodiment, the metal material layer 185' may be provided in the first contact hole CH1 without a barrier film. By omitting a barrier film having a relatively large resistance, a contact resistance between the contact plug 185 and the metal silicide film 120 may decrease, and the size of the first contact structure CS1 may decrease. In the present example embodiment, the metal material layer 185' for the contact plug may be in direct contact with the insulating portion 160 at inner side walls of the first contact hole CH1.

Figure 6D:
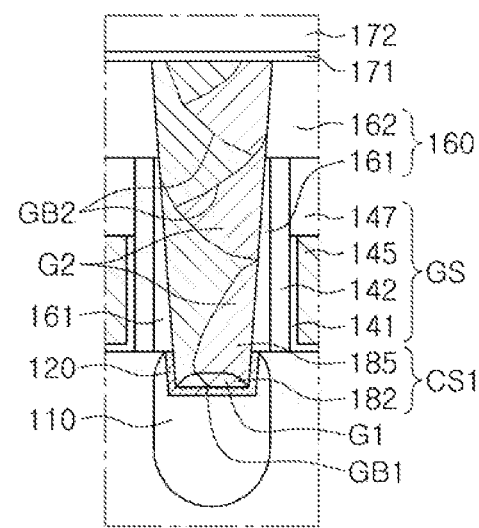

Next, referring to FIG. 6D, a contact plug material 185T and the seed material layer 182T positioned on the insulating portion 160 may be removed by polishing. For example, planarization processing such as chemical-mechanical polishing (CMP) may be performed to expose an upper surface of the capping insulating film 162. A portion of the metal material layer 185' (FIG. 6C) that is positioned on the capping insulating film 162 may be removed, and only a portion of the metal material layer 185' that fills the first contact hole CH1 may remain and be provided as the contact plug 185. The contact plug 185 may have an upper surface that is substantially coplanar with the upper surface of the insulating portion 160. Then, a BEOL process may be used to forming the wiring line 190 connected to the first contact structure CS1, together with the first and second inter-layer insulating layers 172 and 173 in subsequent processing. The second contact structure CS2 may be formed by processing like that for the first contact structure CS1.

The contact structures may be modified in various forms. For example, a region in which the seeding layer is formed may vary depending on deposition, and in a stack of the contact structure, a combination of a seeding layer and a contact metal may vary.

Figure 7:
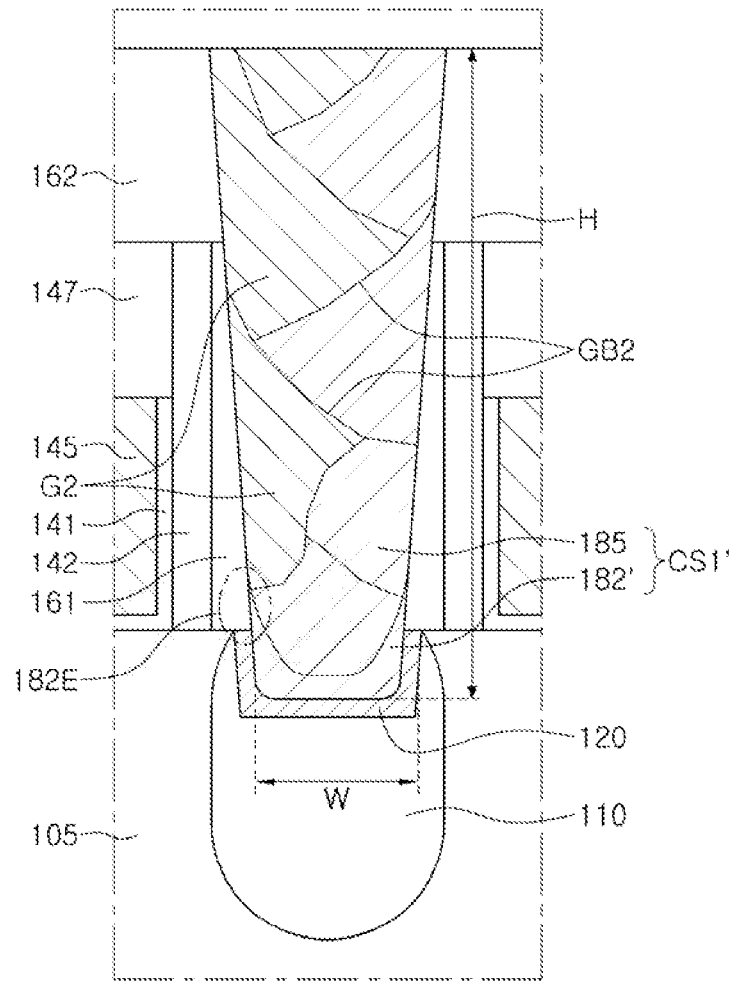
FIGS. 7 and 8 are cross-sectional views of contact structures that may be adopted for the semiconductor device according to various example embodiments (formation at a side surface) (formation of a fine structure)
Figure 8:
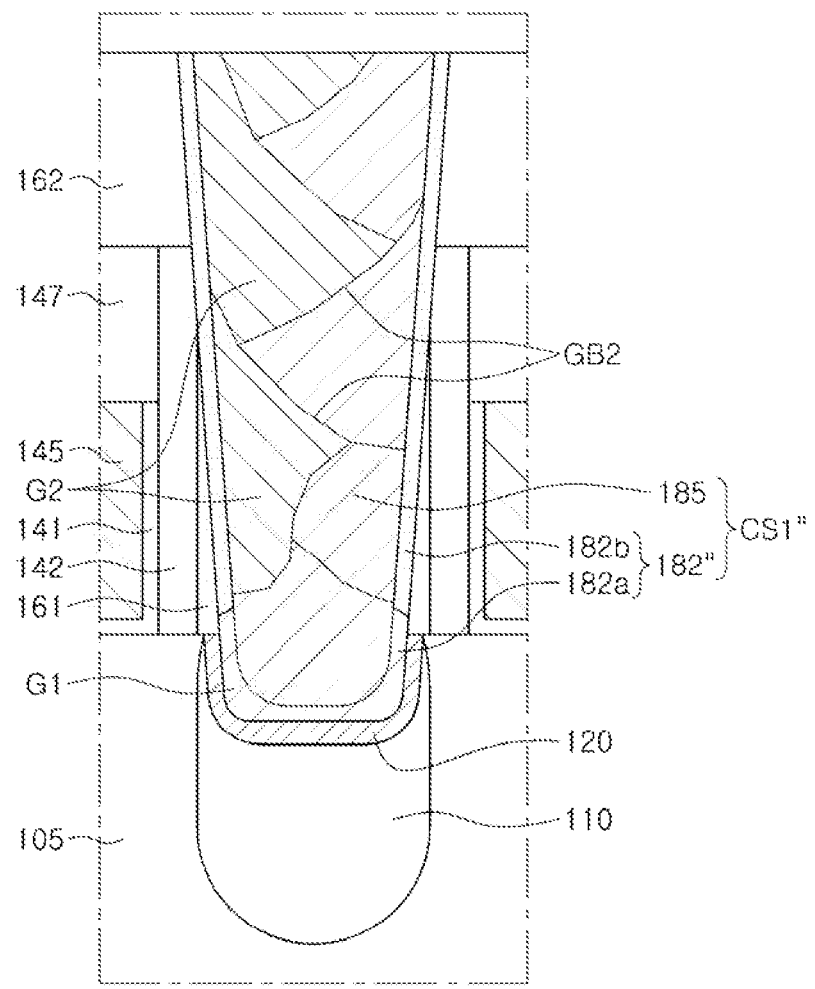

FIGS. 7 and 8 are cross-sectional views of contact structures that may be adopted for the semiconductor device according to various example embodiments. The cross-sectional views show enlarged views of the part "A1" of FIG. 2A as illustrated in FIG. 3.

It may be understood that a first contact structure CS1' illustrated in FIG. 7 is like the first contact structure CS1 illustrated in FIG. 3, except that the first contact structure CS1' includes a seeding layer 182' extending to a part of the inner side wall of the first contact hole CH1. Further, components of the present example embodiment may be understood with reference to a description of the same or similar components of the example embodiment illustrated in FIGS. 1 through 4 (particularly, FIG. 3), unless clearly indicated otherwise.

In the present example embodiment, the seeding layer 182' is formed on the bottom of the first contact hole CH1, and also has a portion 182E extending on the inner side wall of the first contact hole CH1. The extending portion 182E of the seeding layer 182' may include a crystalline portion grown from the metal silicide film 120, which may be crystalline. The contact plug 185 may be grown from the surface of the seeding layer 182' and may have crystalline orientation according to crystalline orientation of the seeding layer 182'. Two materials may be substantially lattice-matched to each other at an interface between the contact plug 185 and the seeding layer 182', and as a result, the contact plug 185 may have a relatively large grain size.

A case where the first contact structure CS1' has a small size is illustrated. The first contact structure CS1' having a small size has a relatively small cross-sectional area. Therefore, even in a case where the contact plug 185 includes a polycrystalline metal, there is a possibility that a grain boundary is not observed in some selected cross sections.

The size of the first contact structure CS1' may be defined as a bottom width W and a height H. The bottom width W of the first contact structure CS1' may be, but is not limited to, 20 nm or less, or 15 nm or less. In an example embodiment, an aspect ratio of the height H to the bottom width W of the first contact structure CS1' may be 3:1 or greater.

With respect to FIG. 8, it may be understood that a first contact structure CS1" illustrated in FIG. 8 is like the first contact structure CS1 illustrated in FIG. 3, except that the first contact structure CS1" includes a seeding layer 182" extending to the entire or almost the entire inner side wall of the first contact hole CH1, and an extending second portion 182b of the seeding layer 182" is not formed of a crystalline metal. Further, components of the present example embodiment may be understood with reference to a description of the same or similar components of the example embodiment illustrated in FIGS. 1 through 4 (particularly, FIG. 3), unless clearly indicated otherwise.

In the present example embodiment, the seeding layer 182" includes a first portion 182a positioned on the bottom of the first contact hole CH1, and the second portion 182b extending on the inner side wall of the first contact hole CH1. The second portion 182b of the seeding layer 182" may be disposed along almost the entire inner side wall of the first contact hole CH1. The first portion 182a may include a crystalline (monocrystalline or polycrystalline) portion grown from the metal silicide film 120, and the second portion 182b may be amorphous or amorphous-like from the insulating portion 160 serving as the inner wall surface. The contact plug 185 may be grown from the surface of the first portion 182a of the seeding layer 182" and may have crystalline orientation according to crystalline orientation of the first portion 182a. Two materials may be substantially lattice-matched to each other at an interface between the contact plug 185 and the first portion 182a of the seeding layer 182", and as a result, the contact plug 185 may have a relatively large grain size, thereby providing a low-resistance contact structure.

Figure 9:
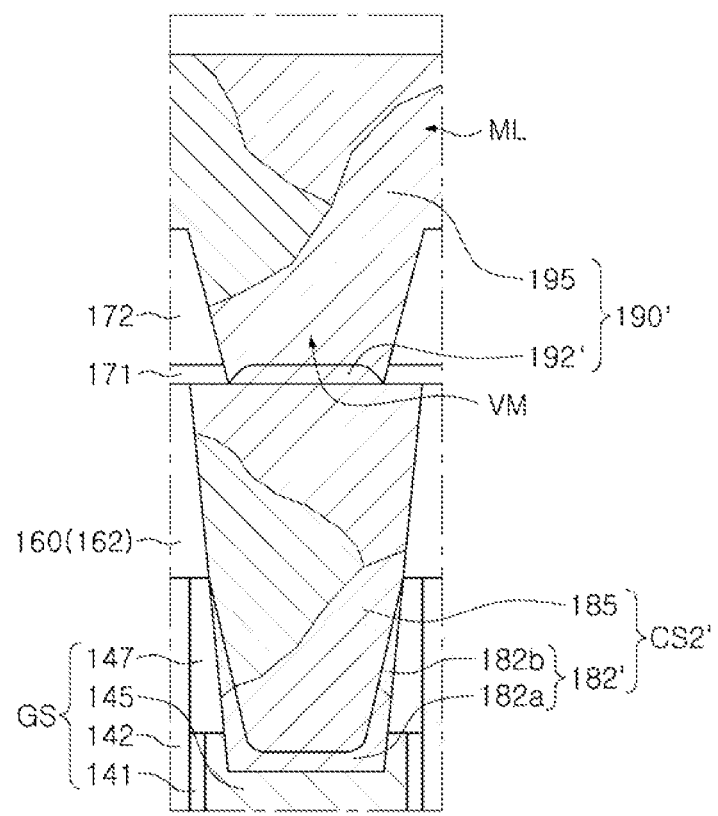
FIG. 9 is a cross-sectional view illustrating a contact structure that may be adopted for the semiconductor device according to an example embodiment.

FIG. 9 is a cross-sectional view illustrating a contact structure that may be adopted for the semiconductor device according to an example embodiment. The cross-sectional view shows an enlarged view of the part "A2" of FIG. 2B as illustrated in FIG. 5.

It may be understood that a stack of a second contact structure CS2' and the metal via VM illustrated in FIG. 9 is like the stack of the second contact structure CS2 and the metal via VM illustrated in FIG. 5, except for positions where a first seeding layer 182' and a second seeding layer 192 are formed. Further, components of the present example embodiment may be understood with reference to a description of the same or similar components of the example embodiment illustrated in FIGS. 1, 2A through 2C, and 5 (particularly, FIG. 5), unless clearly indicated otherwise.

In the present example embodiment, the seeding layer 182' includes a first portion 182a' positioned on the bottom of the second contact hole CH2, and a second portion 182b' extending on an inner side wall of the second contact hole CH2. The second portion 182b' of the seeding layer 182' may be disposed along a part of the side wall of the second contact hole CH2 and may be amorphous or amorphous-like, unlike the example embodiment described above. On the other hands, the first portion 182a' may include a crystalline (monocrystalline or polycrystalline) portion grown from the metal silicide film 120, and the contact plug 185 may be grown from the surface of the first portion 182a' of the seeding layer 182', and has crystalline orientation according to crystalline orientation of the first portion 182a'.

Crystal lattices of two materials may be substantially matched to each other at an interface between the contact plug 185 and the first portion 182a of the seeding layer 182'.

A wiring line 190' may include a wiring line seeding layer 192' in a partial region of the upper surface of the contact plug 185, and the fill metal 195 on the wiring line seeding layer 192'. The wiring line seeding layer 192' may include a crystalline conductive material, the fill metal 195 may be grown from the surface of the wiring line seeding layer 192' and has crystalline orientation according to crystalline orientation of the seeding layer 192'. Two materials may be substantially lattice-matched to each other at an interface between the contact plug 185 and the seeding layer 192'.

As such, the contact plug 185 and the fill metal 195 may have a relatively large grain size, thereby providing a low-resistance contact structure and wiring structure, respectively.

The above-described wiring lines 190 and 190' may also be applied to another type of semiconductor device. For example, the fin-type transistor (FinFET) including the fin-type channel region as illustrated in FIGS. 2A through 2C has been described as the semiconductor device according to an example embodiment, but the semiconductor device is not limited thereto. The semiconductor device according to some example embodiments may include a tunneling field-effect transistor (FET), a transistor including a nanowire, a transistor including a nanosheet (that is, multi-bridge channel FET (MBCFET) (registered trademark)), or various three-dimensional (3D) transistors.

Figure 10:
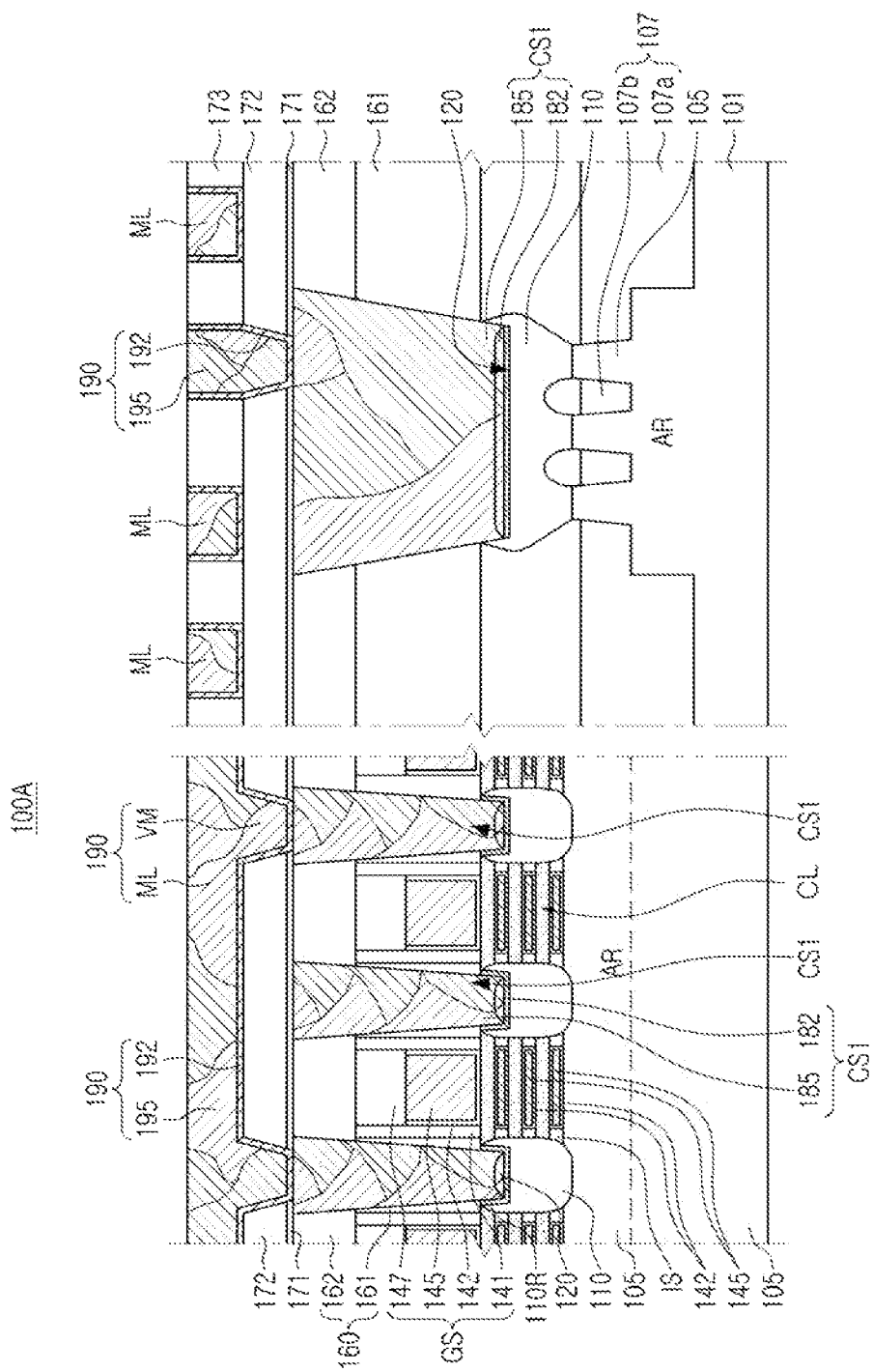
FIG. 10 is a cross-sectional view of a semiconductor device according to an example embodiment.

FIG. 10 is a cross-sectional view illustrating a transistor including a nanosheet (an N-MOSFET) as a semiconductor device according to an example embodiment.

Referring to FIG. 10, it may be understood that a semiconductor device 100A is like the semiconductor device illustrated in FIGS. 1 through 5, except that a structure corresponding to the fin-type active region 105 of the example embodiment described above is a multi-channel structure using a nanosheet. Further, components of the present example embodiment may be understood with reference to a description of the same or similar components of the example embodiment illustrated in FIGS. 1 through 5, unless clearly indicated otherwise.

As illustrated in FIG. 10, the semiconductor device 100A may include a plurality of channel layers CL that are on an active region AR so as to be spaced apart from each other in the third direction (the Z direction of FIG. 1) perpendicular to an upper surface of a substrate 101 and are each formed in a nanosheet structure, and gate electrodes 145 surrounding the plurality of channel layers CL and extending in the second direction (the Y direction of FIG. 1) intersecting the third direction (the Z direction of FIG. 1). As such, the gate electrodes 145 may be interposed between gate spacers 141, and between the plurality of channel layers CL.

The semiconductor device 100A may include source/drain regions 110 in portions of the active region AR that are positioned on opposite sides of the gate electrode 145, the source/drain regions 110 being connected to the plurality of channel layers CL. In the present example embodiment, the source/drain regions 110 may be in fin-type active regions 105 positioned on opposite sides of the gate electrode 145, and may be connected to opposite sides of the plurality of channel layers CL in the first direction (for example, the X direction), respectively. In the present example embodiment, a case where the number of channel layers CL is three is illustrated, but the number of channel layers CL is not particularly limited thereto. The channel layers CL may include semiconductor patterns. For example, the semiconductor patterns may be formed of at least one of silicon (Si), silicon germanium (SiGe), or germanium (Ge).

The source/drain region 110 may include a re-grown epitaxial region formed by using the plurality of channel layers CL and the active region AR as seeds. The source/drain region 110 may be formed of silicon (Si), and may be doped with an N-type impurity (for example, phosphorus (P), nitrogen (N), arsenic (As), or antimony (Sb)).

The semiconductor device 100A according to the present example embodiment may include internal spacers IS disposed between the respective source/drain regions 110 and the gate electrodes 145. The internal spacers IS may be provided on one sides of the gate electrodes 145. The internal spacers IS and the channel layers CL may be alternatively arranged along the third direction. Each of the source/drain regions 110 may be in contact with the channel layers CL, and may be spaced apart from the gate electrodes 145 while having the internal spacers IS interposed therebetween. A gate insulating layer 142 may be interposed between the gate electrode 145 and each channel layer CL, and may extend between the gate electrode 145 and each internal spacer IS.

The source/drain region 110 may include three re-grown epitaxial regions that are combined, and a recessed region 110R may be formed in an upper surface of the source/drain region 110 connected to a contact hole. A metal silicide film 120 is on along the surface of the recessed region 110R of the source/drain region 110. Similar to the example embodiment described above, a first contact structure CS1 may include a seeding layer 182 on the metal silicide film 120 and a contact plug 185 on the seeding layer 182.

Each of the seeding layer 182 and the contact plug 185 may include a polycrystalline metal. The seeding layer 182 and the contact plug 185 may include a first crystalline metal and a second crystalline metal, respectively. The crystalline orientation of the second crystalline metal depends on the crystalline orientation of the first crystalline metal, which is the seeding layer 182, and the second crystalline metal may be deposited on the first crystalline metal like the epitaxial growth. The second crystalline metal may be substantially lattice-matched to a crystal lattice of the first crystalline metal at an interface between the seeding layer 182 and the contact plug 185.

In an example embodiment, the first and second crystalline metals may have the same crystal structure (for example, a body centered cubic (BCC) structure). Further, lattice constants of the first and second crystalline metals may be substantially the same as each other or a difference between the lattice constants of the first and second crystalline metals may be significantly small. For example, the difference between the lattice constants α1 and α2 of the first and second crystalline metals may be less than 1%. In an example embodiment, one of the seeding layer 182 and the contact plug 185 may include tungsten (W) and the other one of the seeding layer 182 and the contact plug 185 may include molybdenum (Mo). Thus, grains of the contact plug 185 may have an increased size according to a grain size of the seeding layer 182. As the grain size increases, the contact plug 185 having a low resistance may be provided. Although not illustrated, a second contact structure connected to the gate electrode 145 may be implemented as a low-resistance contact structure, like the first contact structure CS1.

A wiring line 190 on the first contact structure CS1 may include a wiring line seeding layer 192 and a fill metal 195 on the wiring line seeding layer 192. Like the first contact structure CS1 described above, crystal lattices of grains of the wiring line seeding layer 192 and adjacent grains of the fill metal 195 may be substantially matched to each other to thereby implement the wiring line 190 having a low resistance.

Figure 11:
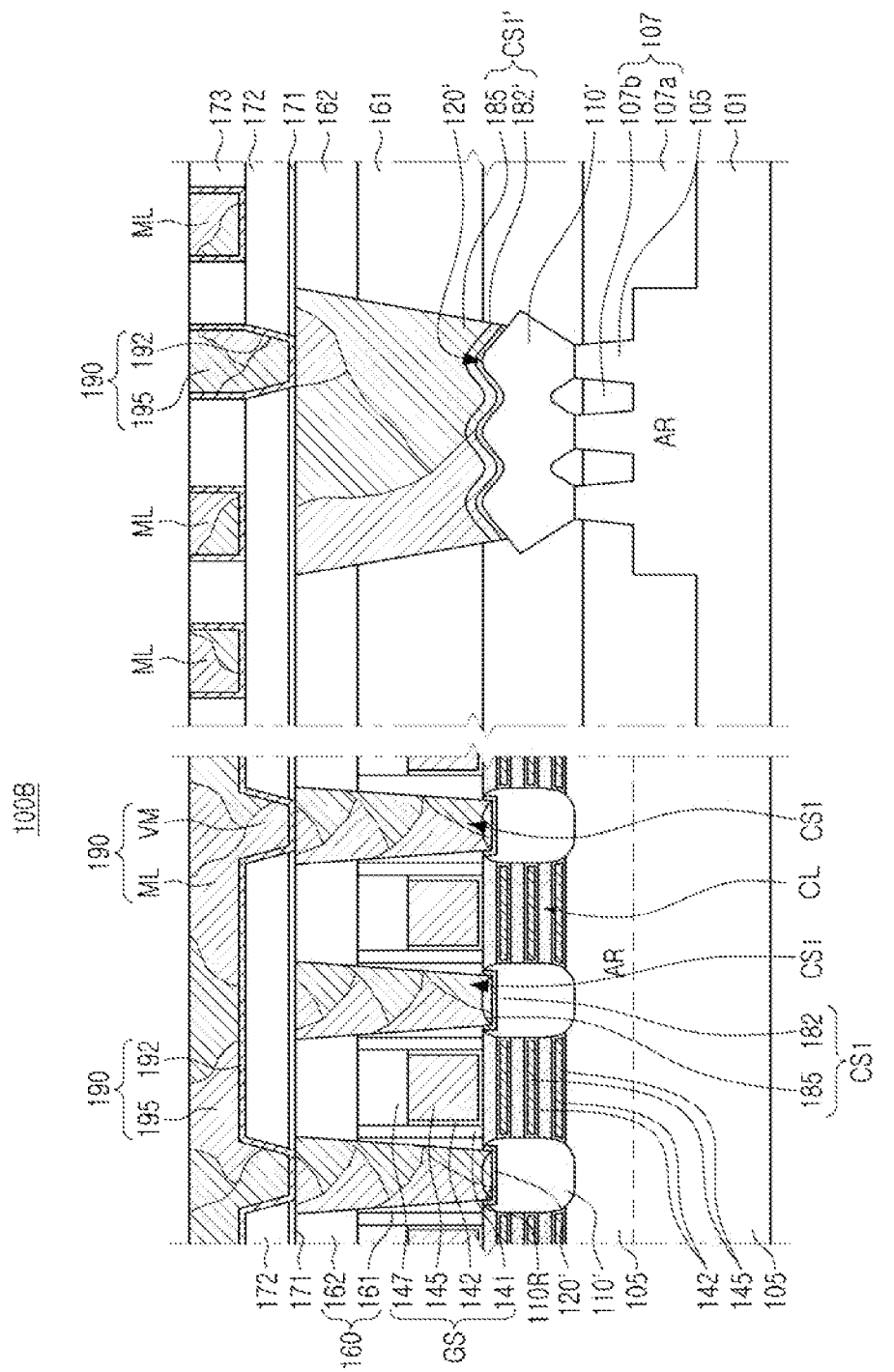
FIG. 11 is a cross-sectional view of a semiconductor device according to an example embodiment.

FIG. 11 is a cross-sectional view illustrating a transistor including a nanosheet (a P-MOSFET) as a semiconductor device according to an example embodiment.

Referring to FIG. 11, the semiconductor device 100B has a multi-channel structure using a nanosheet like the example embodiment illustrated in FIG. 10, and is implemented by a P-MOSFET. Similar to the example embodiment described above, it may be understood that the semiconductor device 100B according to the present example embodiment is like the semiconductor devices illustrated in FIGS. 1 through 5 and FIG. 10. Further, components of the present example embodiment may be understood with reference to a description of the same or similar components of the example embodiments illustrated in FIGS. 1 through 5 and FIG. 10, unless clearly indicated otherwise.

Referring to FIG. 11, the semiconductor device 100B according to the present example embodiment may include a plurality of channel layers CL that are on an active region AR so as to be spaced apart from each other in the third direction (the Z direction of FIG. 1) perpendicular to an upper surface of a substrate 101 and are each formed in a nanosheet structure, and gate electrodes 145 surrounding the plurality of channel layers CL and extending in the second direction (the Y direction of FIG. 1) intersecting the first direction (the Z direction of FIG. 1), like the example embodiment described above (FIG. 10). Further, the gate electrode 145 may be interposed between gate spacers 141, and between the plurality of channel layers CL.

The semiconductor device 100B may include source/drain regions 110' in portions of the active region AR that are positioned on opposite sides of the gate electrode 145, the source/drain regions 110' being connected to the plurality of channel layers CL. The source/drain regions 110' may be in fin-type active regions 105 positioned on opposite sides of the gate electrode 145, and may be connected to opposite sides of the plurality of channel layers CL in the first direction (for example, the X direction), respectively. The source/drain region 110' may include an epitaxial layer formed by using the plurality of channel layers CL and the active region AR as seeds. Unlike the example embodiment described above (FIG. 10), the source/drain region 110' may be formed of silicon-germanium (SiGe), and may be doped with a P-type impurity (for example, boron (B), indium (In), gallium (Ga), boron trifluoride ($BF_3$)).

Unlike the example embodiment described above, in the semiconductor device 100B according to the present example embodiment, the source/drain region 110' and the gate electrode 145 may be in direct contact with each other without the internal spacers IS.

The source/drain region 110' may include three re-grown epitaxial regions (a cross section in the Y direction may have a pentagonal shape) that are combined, and a metal silicide film 120' may be formed along an indented crystal face of the source/drain region 110'. A first contact structure CS1' may include a seeding layer 182' on the metal silicide film 120', and a contact plug 185 on the seeding layer 182'.

Each of the seeding layer 182' and the contact plug 185 may include a polycrystalline metal. The seeding layer 182' and the contact plug 185 may include a first crystalline metal and a second crystalline metal, respectively. Crystalline orientation of the second crystalline metal depends on crystalline orientation of the first crystalline metal, which is the seeding layer 182', and the second crystalline metal may be deposited on the first crystalline metal like the epitaxial growth. Specifically, a crystal lattice of the second crystalline metal that is adjacent to an interface between the seeding layer 182' and the contact plug 185 may be matched to a crystal lattice of the first crystalline metal. In such a matching process, grains of the contact plug 185 may have an increased size according to a grain size of the seeding layer 182'. As the grain size increases, the contact plug 185 having a low resistance may be provided. Although not illustrated, a second contact structure connected to the gate electrode 145 may be implemented in a similar manner.

In an example embodiment, a wiring line 190 on the first contact structure CS1 may include a wiring line seeding layer 192 and a fill metal 195 on the wiring line seeding layer 192. Like the first contact structure CS1 described above, crystal lattices of grains of the wiring line seeding layer 192 and adjacent grains of the fill metal 195 may be substantially matched to each other to implement the wiring line 190 having a low resistance.

Figure 12:
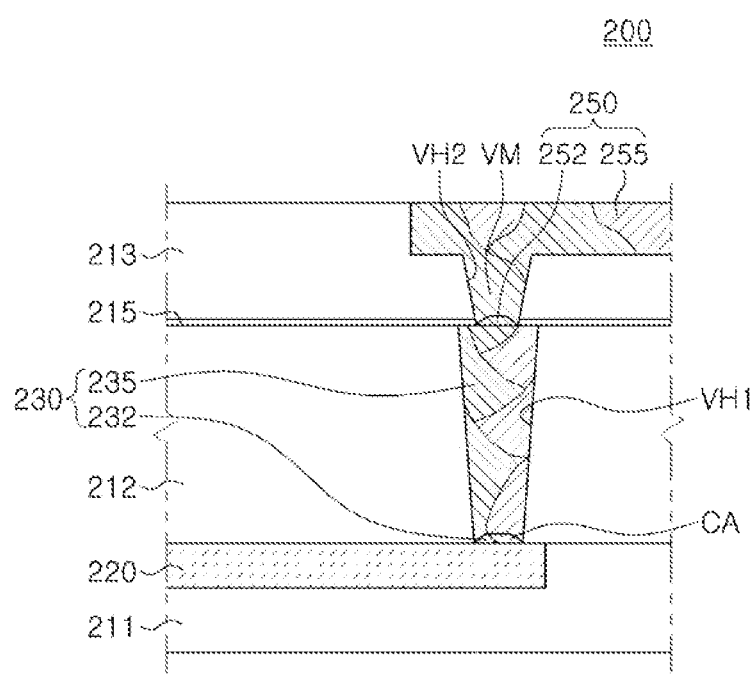
FIG. 12 is a cross-sectional view illustrating a semiconductor device according to an example embodiment.

FIG. 12 is a cross-sectional view illustrating a semiconductor device according to an example embodiment.

A semiconductor device 200 illustrated in FIG. 12 may include a substrate 211 having a contact region, a first inter-layer insulating layer 212 on the substrate 211 and having a first contact hole VH1 connected to a contact region CA, and a contact structure 230 on the contact region in the first contact hole VH1.

The contact structure 230 may include a first seeding layer 232 formed of a first crystalline metal, and a first contact metal 235 on the first seeding layer 232, filling the first contact hole VH1, and formed of the second crystalline metal. The second crystalline metal may be substantially lattice-matched to the first crystalline metal at an interface between the first crystalline metal and the second crystalline metal. In the present example embodiment, a case where a partial region of a conductive line 220 is provided as the contact region CA is illustrated. However, the contact region CA may be an active region like the source/drain region, or a metal silicide film, like the example embodiment described above.

The semiconductor device 200 according to the present example embodiment includes an etch stop film 215 on the first inter-layer insulating layer 212, a second inter-layer insulating layer 213 on the etch stop film 215 and having a second contact hole VH2 connected to the contact structure 230, and a wiring line 250 in the second inter-layer insulating layer 213 and having a metal via VM connected to the contact structure 230 through the second contact hole VH2.

The wiring line 250 may include a second seeding layer 252 formed of a third crystalline metal, and a second contact metal 255 on the second seeding layer 252, filling the second contact hole VH2, and formed of a fourth crystalline metal. The fourth crystalline metal may be substantially lattice-matched to the third crystalline metal at an interface between the third crystalline metal and the fourth crystalline metal.

As such, the third and fourth crystalline metals may have the same crystal structure suitable for lattice matching, and a difference between lattice constants of the third and fourth crystalline metals may be less than 1%. The second and fourth crystalline metals may have relatively larger grain sizes (for example, 7 nm or more) as compared with those of the first and third crystalline metals, and thus electric resistances of the contact structure 230 and the wiring line 250 may decrease.

In an example embodiment, the first crystalline metal may be the same as the third crystalline metal, and the second crystalline metal may be the same as the fourth crystalline metal. For example, the first and third crystalline metals may be tungsten (W), and the second and fourth crystalline metals may be molybdenum (Mo).

By way of summation and review, due to a decrease in a critical dimension (CD) of a contact, contact resistance may increase and various defects may result.

As set forth above, embodiments may provide a semiconductor device having an excellent reliability. As set forth above, according to an example embodiment, the seeding layer may be formed in each of regions positioned on the bottoms of the first and second contact structures to improve bonding strength of the contact plug. As a result, the contact plug may be effectively prevented from falling off during chemical-mechanical polishing (CMP). Further, the contact plug is formed to have a crystal lattice matched to a crystal lattice of the seeding layer, such that a grain size of the contact plug may increase, thereby greatly decreasing a contact resistance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a fin-type active region extending on a substrate in a first direction that is parallel to an upper surface of the substrate;
   a gate structure extending across the fin-type active region in a second direction, parallel to the upper surface of the substrate and different from the first direction;
   a source/drain region in the fin-type active region on one side of the gate structure;
   an insulating portion covering the gate structure and the source/drain region;
   a first contact structure penetrating through the insulating portion and connected to the source/drain region; and
   a second contact structure penetrating through the insulating portion and connected to the gate structure,
   wherein:
   at least one of the first and second contact structures includes a seeding layer on at least one of the gate structure and the source/drain region and including a first crystalline metal, and a contact plug on the seeding layer and including a second crystalline metal different from the first crystalline metal,
   the second crystalline metal is substantially lattice-matched to the first crystalline metal at an interface between the seeding layer and the contact plug,
   the seeding layer is on a bottom of the at least one of the first and second contact structures, and
   the contact plug is in direct contact with the insulating portion at a side wall of the at least one of the first and second contact structures.

2. The semiconductor device as claimed in claim 1, wherein the first and second crystalline metals have a same crystal structure.

3. The semiconductor device as claimed in claim 2, wherein a difference between lattice constants of the first and second crystalline metals is less than 1%.

4. The semiconductor device as claimed in claim 1, wherein one of the first and second crystalline metals is tungsten, and the other one of the first and second crystalline metals is molybdenum.

5. The semiconductor device as claimed in claim 1, wherein a bottom width of the at least one of the first and second contact structures is 20 nm or less.

6. The semiconductor device as claimed in claim 5, wherein the seeding layer has a thickness of 5 nm or less.

7. The semiconductor device as claimed in claim 1, wherein the seeding layer has an extension portion extending on the insulating portion at the side wall of the at least one of the first and second contact structures.

8. The semiconductor device as claimed in claim 7, wherein a portion of the seeding layer that is positioned on the bottom includes a monocrystalline or polycrystalline portion, and the extension portion of the seeding layer includes an amorphous portion.

9. The semiconductor device as claimed in claim 1, wherein the at least one of the first and second contact structures includes the second contact structure, the gate structure includes a gate electrode, and the seeding layer is on the gate electrode.

10. The semiconductor device as claimed in claim 1, further comprising:
an inter-layer insulating layer on the insulating portion; and
a metal line including a metal via penetrating through the inter-layer insulating layer.

11. The semiconductor device as claimed in claim 10, wherein:
the metal line includes:
an additional seeding layer at the metal via and the at least one of the first and second contact structures, and including a third crystalline metal; and
a fill metal on the additional seeding layer and including a fourth crystalline metal different from the third crystalline metal, and
the fourth crystalline metal is substantially lattice-matched to the third crystalline metal at an interface between the additional seeding layer and the fill metal.

12. A semiconductor device, comprising:
a substrate having a contact region;
a first insulating layer on the substrate and having a first contact hole connected to the contact region;
a first seeding layer on the contact region in the first contact hole and including a first crystalline metal; and
a first contact metal on the first seeding layer, filling the first contact hole, and including a second crystalline metal,
wherein the second crystalline metal is substantially lattice-matched to the first crystalline metal at an interface between the first and second crystalline metals, and
wherein a grain size of the second crystalline metal is 7 nm or more.

13. The semiconductor device as claimed in claim 12, wherein the first and second crystalline metals have a same crystal structure, and a difference between lattice constants of the first and second crystalline metals is less than 1%.

14. The semiconductor device as claimed in claim 12, further comprising:
a second insulating layer on the first insulating layer and having a second contact hole connected to the first contact metal;
a second seeding layer on the first contact metal in the second contact hole and including a third crystalline metal; and
a second contact metal on the second seeding layer, filling the second contact hole, and including a fourth crystalline metal,
wherein the fourth crystalline metal is substantially lattice-matched to the third crystalline metal at an interface between the third and fourth crystalline metals.

15. The semiconductor device as claimed in claim 14, wherein the first crystalline metal is the same material as the third crystalline metal, and the second crystalline metal is the same material as the fourth crystalline metal.

16. The semiconductor device as claimed in claim 15, wherein the first and third crystalline metals are tungsten, and the second and fourth crystalline metals are molybdenum.

17. A semiconductor device, comprising:
a fin-type active region extending on a substrate in a first direction, parallel to an upper surface of the substrate;
a gate structure extending across the fin-type active region in a second direction, which is parallel to the upper surface of the substrate and different from the first direction;
a source/drain region in the fin-type active region on one side of the gate structure;
an insulating portion covering the gate structure and the source/drain region;
an inter-layer insulating layer on the insulating portion;
a metal line including a metal via penetrating through the inter-layer insulating layer;
a first contact structure connected to the source/drain region; and
a second contact structure connected to the gate structure, wherein:
at least one of the first and second contact structures includes a seeding layer on at least one of the gate structure and the source/drain region, and a contact plug on the seeding layer,
the seeding layer includes a first crystalline conductive material, and the contact plug includes a second crystalline conductive material,
the first and second crystalline conductive materials have a same crystal structure, and a difference between lattice constants of the first and second crystalline conductive materials is less than 1%, and
the metal line includes:
an additional seeding layer at the metal via and the at least one of the first and second contact structures, and including a third crystalline metal; and
a fill metal on the additional seeding layer and including a fourth crystalline metal different from the third crystalline metal, the fourth crystalline metal being substantially lattice-matched to the third crystalline metal at an interface between the additional seeding layer and the fill metal.

* * * * *